United States Patent [19]

Gardner et al.

[11] Patent Number: 4,673,623
[45] Date of Patent: Jun. 16, 1987

[54] LAYERED AND HOMOGENEOUS FILMS OF ALUMINUM AND ALUMINUM/SILICON WITH TITANIUM AND TUNGSTEN FOR MULTILEVEL INTERCONNECTS

[75] Inventors: Donald S. Gardner, Mt. View; Krishna C. Saraswat, Cupertino; Troy W. Barbee, Jr., Palo Alto, all of Calif.

[73] Assignee: The Board of Trustees of the Leland Stanford Junior University, Stanford, Calif.

[21] Appl. No.: 731,174

[22] Filed: May 6, 1985

[51] Int. Cl.[4] .............................................. H01L 23/48
[52] U.S. Cl. ....................................... 428/620; 428/651
[58] Field of Search ................................ 428/620, 651; 204/192 C; 357/71

[56] References Cited

U.S. PATENT DOCUMENTS

| 4,492,813 | 1/1985 | Kausche et al. | 204/192 C |
| 4,527,184 | 7/1985 | Fischer | 428/620 |

OTHER PUBLICATIONS

R. W. Bower, Appl. Phys. Letters, vol. 23, No. 2, Jul. 15, 1973, pp. 99–101.

Vance Hoffman, Solid State Techn., Dec. 1976, pp. 57–66.

P. S. McLeod et al, J. Vac. Sci. Techn., vol. 14, No. 1, Jan./Feb. 1977, pp. 263–265.

*Primary Examiner*—L. Dewayne Rutledge
*Assistant Examiner*—S. Kastler
*Attorney, Agent, or Firm*—Flehr, Hohbach, Test, Albritton & Herbert

[57] ABSTRACT

Layered structures (e.g., Al-Si/Ti/Al-Si . . . ) and homogeneous alloys of aluminum and aluminum/1 at. % silicon with titanium and tungsten and other refractory metals have been found to significantly reduce hillock densities in the films when small amounts of titanium or tungsten are homogeneously added. However, the resistivity of the films can become excessive. In addition, a new type of low density hillock can form. Layering of the films eliminates all hillocks and results in films of low resistivity. Such layered and homogeneous films made with Al-Si and Ti were found to be dry etchable. Electrical shorts in test structures with two levels of metal and LPCVD $SiO_2$ as an interlayer dielectric have been characterized and layered films using Al-Si and Ti gave excellent results.

15 Claims, 15 Drawing Figures

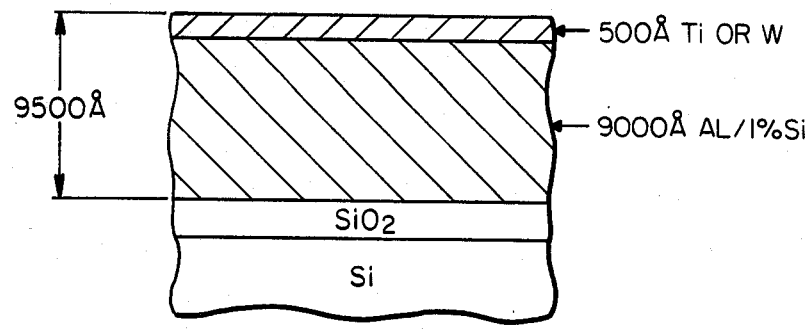
FIG_1A
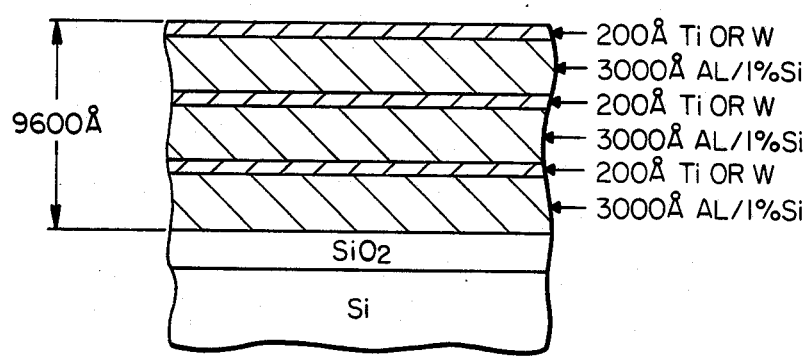
FIG_1B
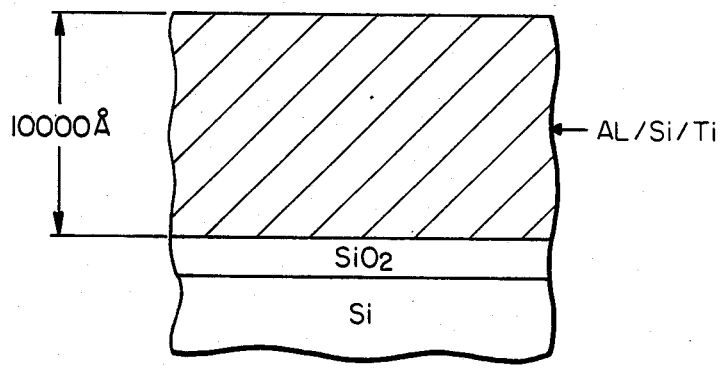
FIG_1C

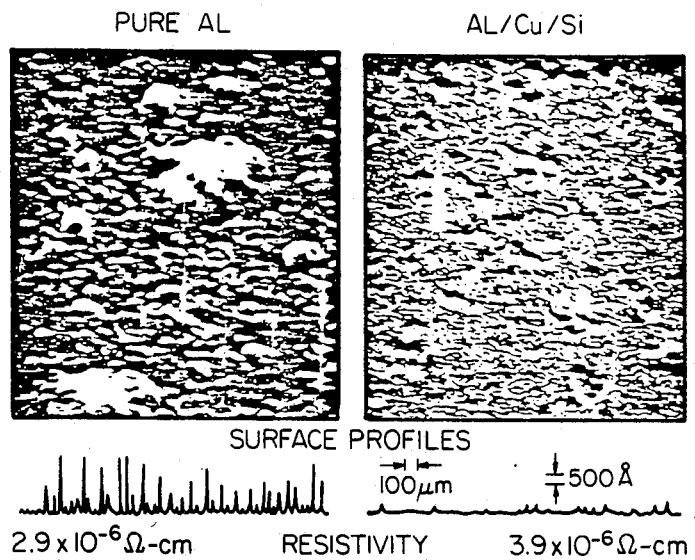
FIG_2
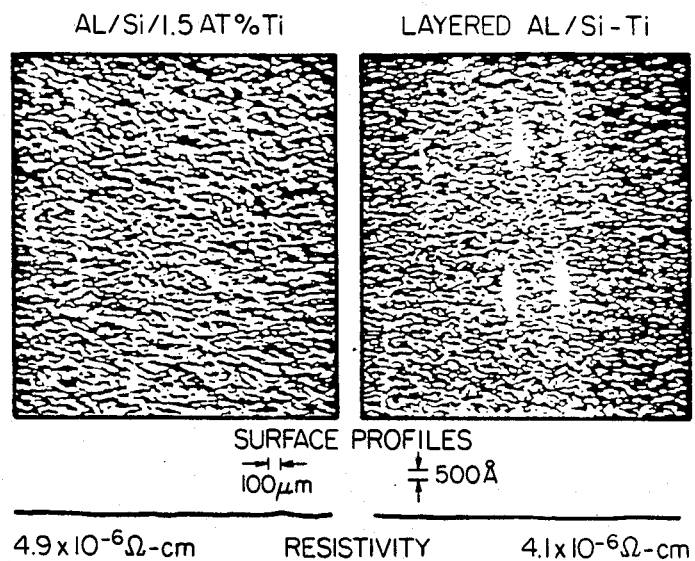
FIG_3

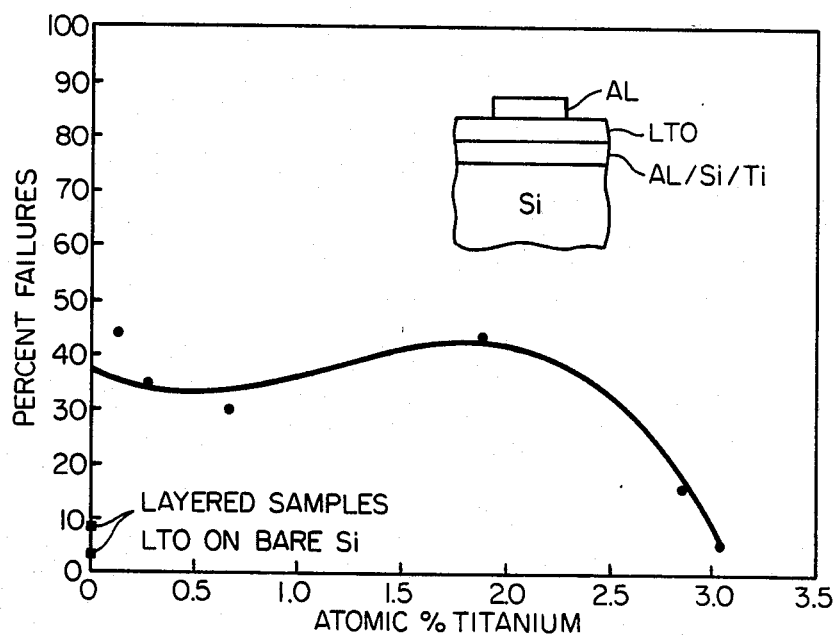
FIG_4
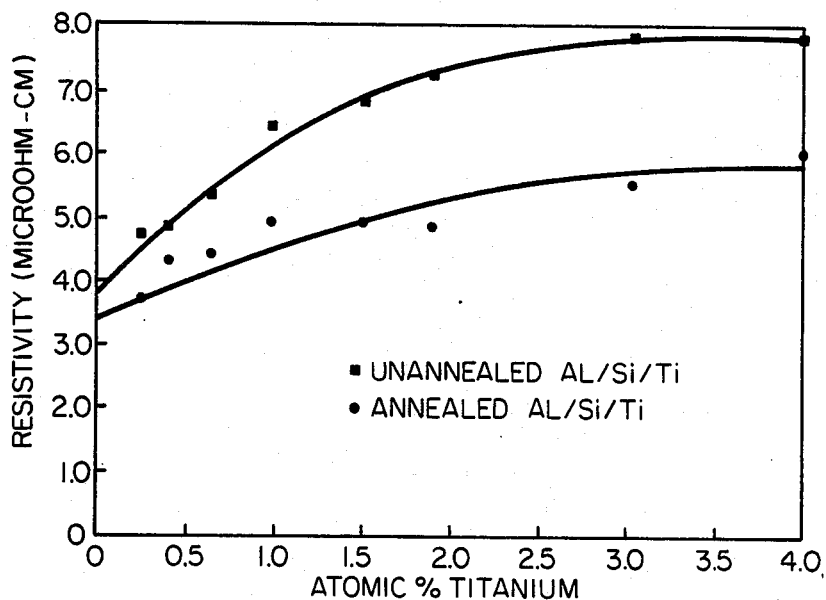
FIG_5

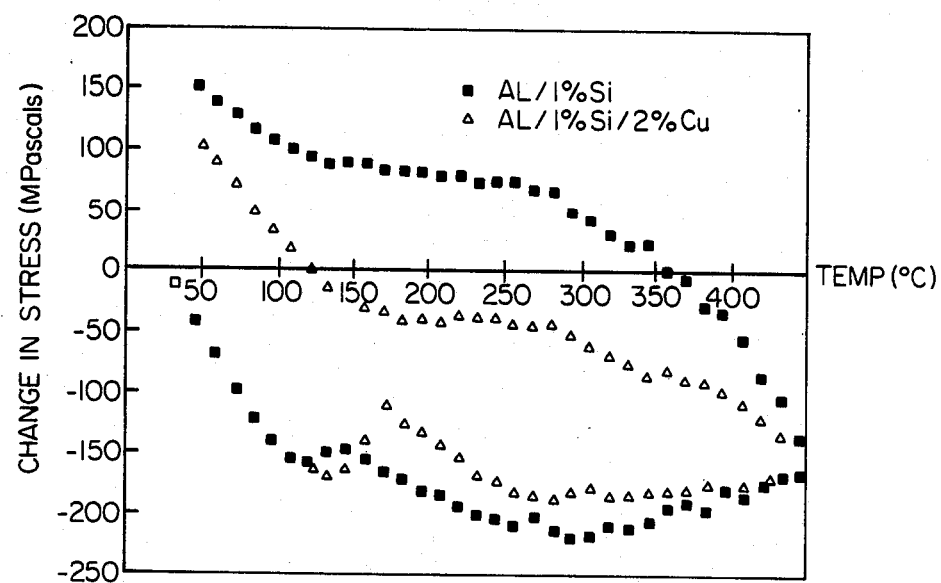
FIG_6
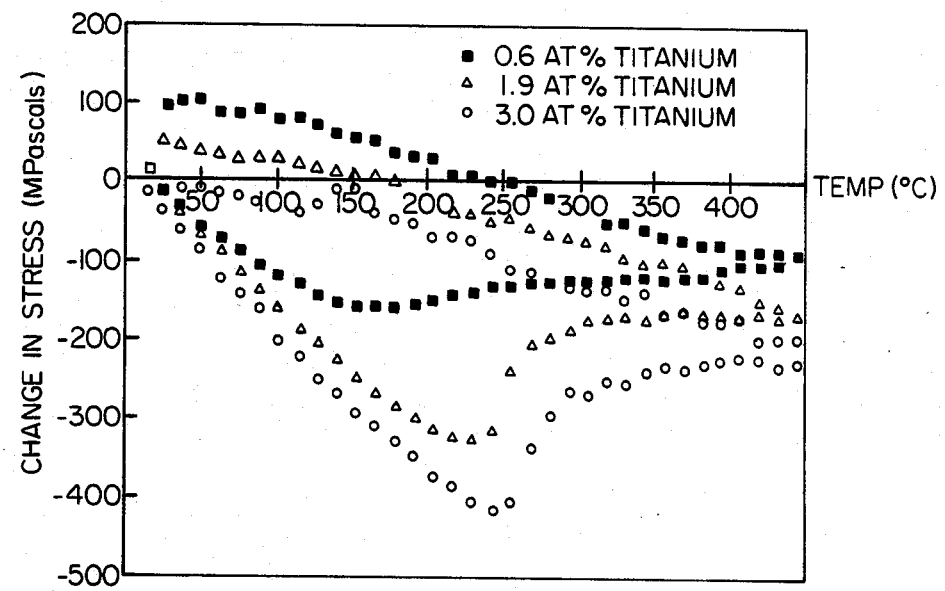
FIG_7A

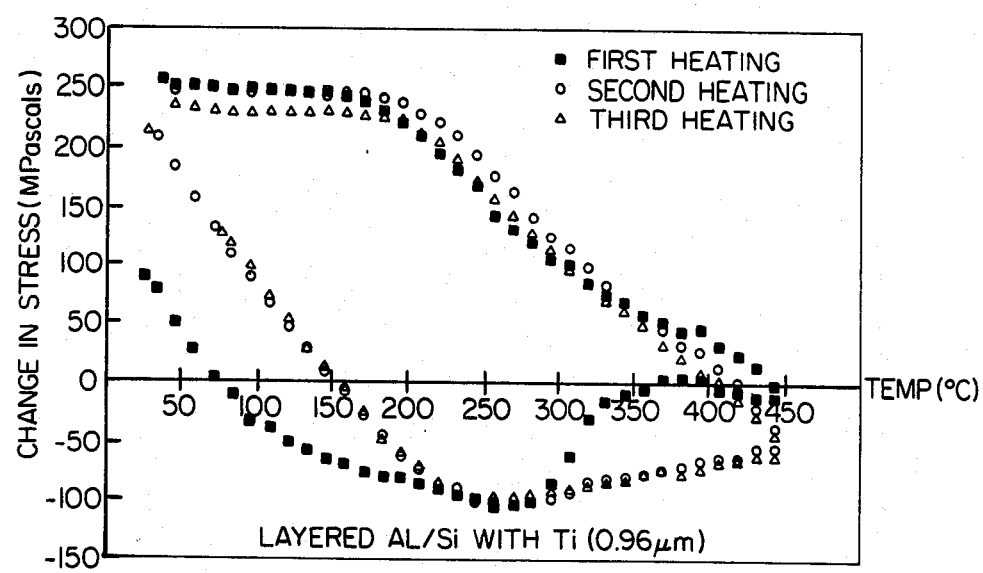
FIG_7B
i) AL/Si WITH Ti ON TOP
ii) AL/Si WITH Ti ON BOTTOM
iii) LAYERED AL/Si-Ti
SURFACE PROFILES OF LAYERED AL-Ti METAL SYSTEMS
FIG_8B

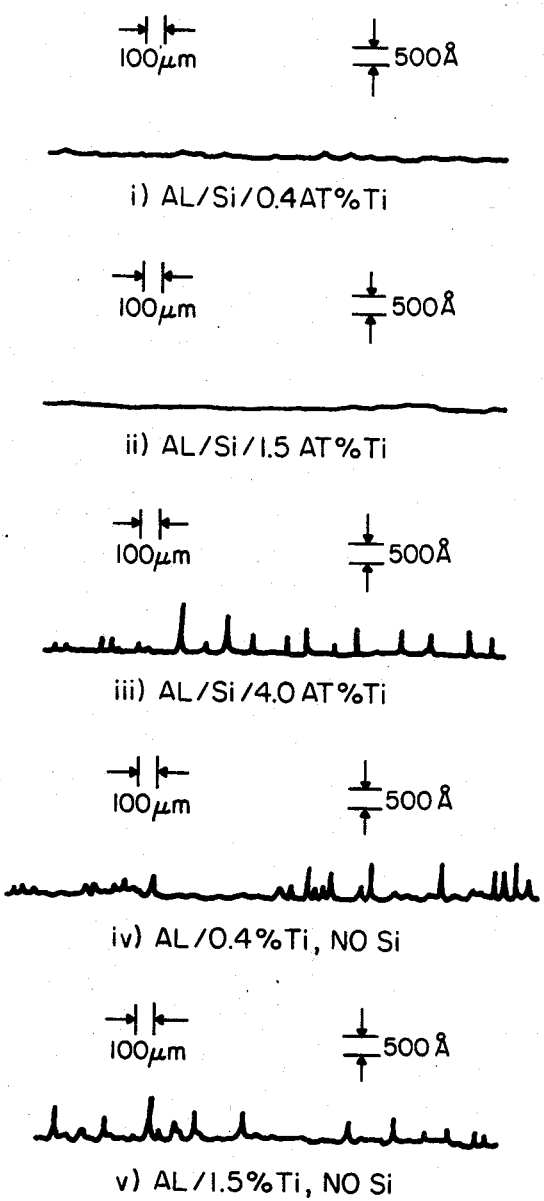
SURFACE PROFILES OF HOMOGENEOUS AL-Ti METAL SYSTEMS
FIG_8A

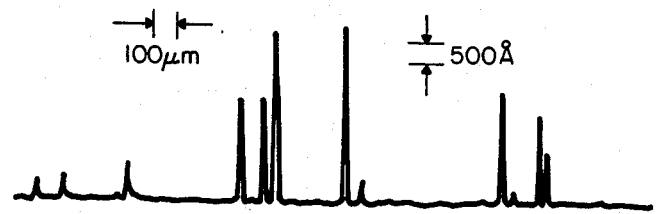
A) AL/1%Si/0.5%W
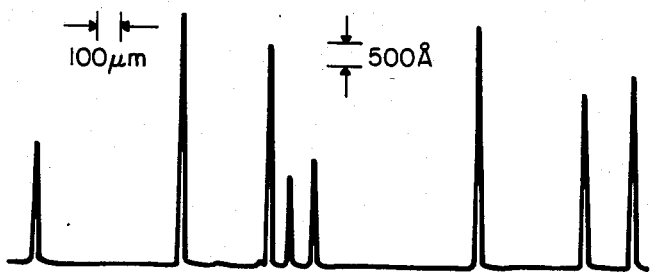
B) AL/1%Si/3.6%W
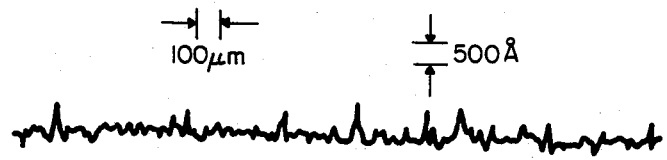
C) AL/1%Si WITH W ON TOP
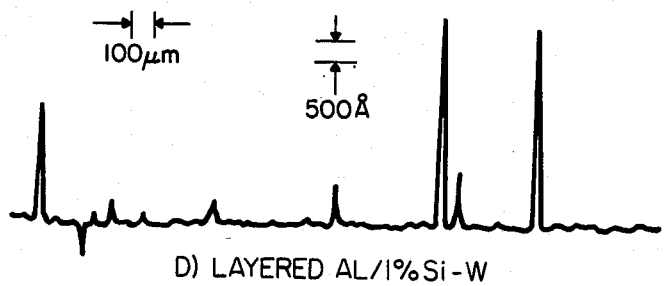
D) LAYERED AL/1%Si-W
SURFACE PROFILES OF AL/W METAL SYSTEMS
FIG_9

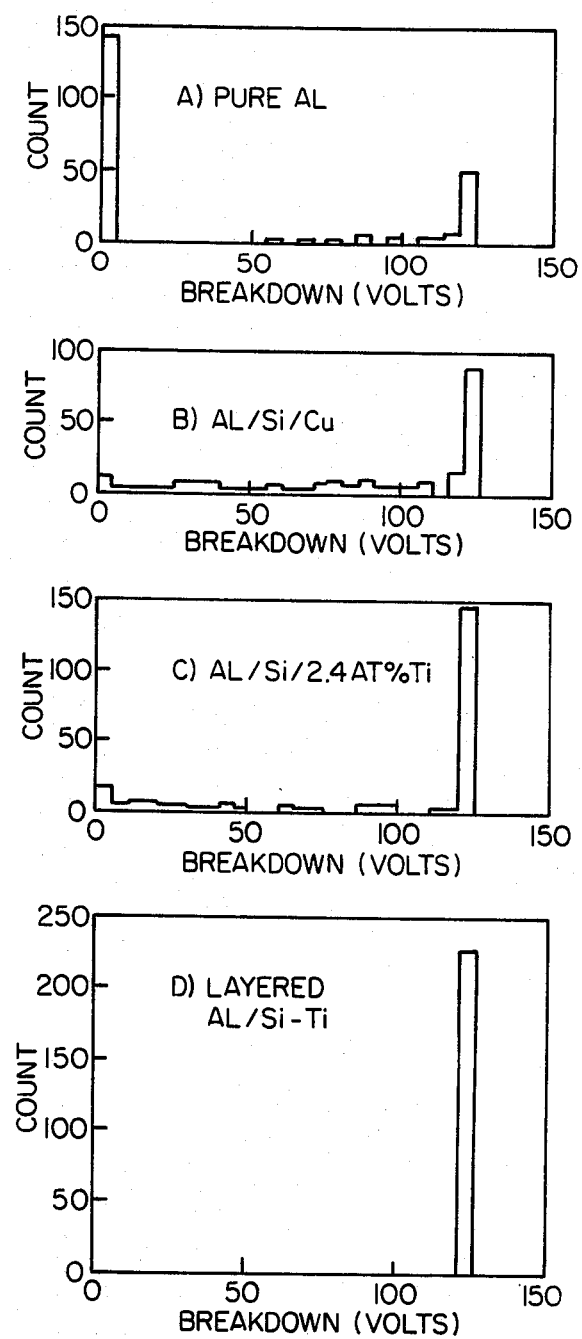
SHORTS TESTING USING CAPACITOR ARRAYS
FIG_10

LAYERED AL/Si-Ti  HOMOGENEOUS AL/Si/Ti 
ETCHED IN CCL$_4$ AND N$_2$
PLASMA ETCHED ALUMINUM INTERCONNECTS
*FIG_11*

LAYERED AND HOMOGENEOUS FILMS OF ALUMINUM AND ALUMINUM/SILICON WITH TITANIUM AND TUNGSTEN FOR MULTILEVEL INTERCONNECTS

This invention is directed to the field of semiconductor devices, and more particularly to films useful in interconnects in integrated circuits.

With advances in integrated circuit technology, device dimensions are being scaled down and concurrently the chip size and complexity are continually increasing. Since the smaller size of devices makes them faster, circuit performance should improve. However, the higher complexity and larger chip size require closely spaced, long interconnecting lines. As a result, the RC time delay, the IR voltage drop, the power consumption and cross-talk noise associated with the interconnection lines can become appreciable. Thus, even with very fast devices, the overall performance of a large circuit can be seriously affected by the limitations of the interconnections.

To accomodate the needs of future VLSI technology, new materials must be investigated for use in fabricating multilevel interconnections. In this application, the term, "level" will be used to describe conductors which are separated by an insulator; the term, "layer" will be used to describe different conductors together at one level of interconnection.

For a long time, aluminum has been used to form the metal in interconnections; however, as device dimensions are scaled down, the current density increases, resulting in a decrease in reliability. Some of the problems with pure aluminum are electromigration, high solubility and diffusivity of silicon leading to poor contact reliabilty to shallow junctions, and hillock formation causing electrical shorts between successive levels of aluminum. Such hillock formation is an especially notable problem in multilevel interconnection films, causing shorts between levels.

However, aluminum is preferred over most other metals for interconnection structures because of its low resistivity and silicon compatibility. Tungsten has been used for interconnections, and it has been urged that the resistance of CVD tungsten can be as good as deposited aluminum when step coveraged is considered. However, various planarization processes can be used to overcome the increased resistances associated with thickness reduction and steps. Aluminum-copper is sometimes used to solve problems characteristic of pure aluminum. However, it is known that it is difficult to dry etch this combination; the combination corrodes easily; and, hillocks are not completely eliminated. In addition, it has been found that copper rapidly diffuses through $SiO_2$ degrading underlying device characteristics.

Studies have been done on the problem of hillock formation due to electrical and/or thermal stress. Hillocks form in part because of large differences between the thermal expansion coefficients of Al and Si. One known method of reducing these hillocks is to deposit a film beneath the Al which has an expansion coefficient between that of Al and Si. This is usually done with silicides such as $WSi_2$ or $MoSi_2$. It was also tried with a Ti-W alloy as the bottom layer, but with no noticeable improvement in hillock density, although an increase in electromigration lifetime has been reported.

It is an objective of the present invention to provide an improved film for use in providing interconnections in an integrated circuit.

It is a further objective of the present invention to provide an improved film incorporating aluminum for use as an interconnection level in multilevel interconnection structures used ion integrated circuits.

It is another objective of the present invention to provide a multilayer interconnection film incorporating aluminum which has reduced hillocks in order to minimize breakdown in multilevel interconnection or capacitor structures in integrated circuits.

Another objective is to provide a structure which is dry etchable, to facilitate processing.

Yet another objective is to provide smooth conductive films having reduced electrical resistivity.

These and other objectives of the present invention are achieved by fabricating a film for a VLSI interconnection incorporating Al-Si which may be alternatively layered with refractory metals at each interconnection level or which may incorporate a refractory metal in a homogeneous level for a multilevel interconnection structure. It has been found that titanium (Ti) is especially useful in forming such structures; tungsten was also tested with some limited success. It is speculated that Zr, Hf, $V_2$ and Ta will also prove to be satisfactory.

It has further been found that a sputtering technique is especially useful in laying down such films. The success of this technique has baffled many prior researchers in this field. Prior researchers have tried to alloy aluminum with metals such as titanium and have found that the resulting film have very high resistivity, making it unsuitable. This research has demonstrated that aluminum, silicon and titanium together resulted in useful films. The key features of this invention include the addition of both silicon and titanium to aluminum to provide the film, and the discovery that such a film may be laid down either as a homogeneous film or as a layered film comprising alternate layers of aluminum-silicon and the refractory metals such as titanium. The invention will be better understood with respect to the following figures wherein:

FIG. 1A, 1B, and 1C are cross sections schematic of homogeneous and layered structures incorporating the present invention;

FIG. 2 comprises SEM photomicrographs, surface profiles and resistivity of pure Al and Al-Cu-Si, showing hillocks;

FIG. 3 comprises SEM photomicrographs, surface profiles and resistivity of homogeneous and layered films using Al-Si and Ti;

FIG. 4 is a chart of failures by shorting in a two-level metal interconnection test structure as a function of atomic percentage of Ti;

FIG. 5 comprises a chart showing resistivity of homogeneous Al-Si-Ti films as a function of atomic percentage Ti;

FIG. 6 shows mechanical stress versus measurement temperature of Al-Si and Al-Si-Cu films;

FIG. 7A shows stresses in homogeneous Al-Si-Ti films versus measurement temperature;

FIG. 7B shows stresses in layered Al-Si with Ti films versus temperature;

FIG. 8A and 8B comprises surface profiles of various Al-Si metal systems used in conjunction with titanium;

FIG. 9 comprises surface profiles of Al-W metal systems;

FIG. 10 illustrates test results of two level metal capacitor arrays formed of at least one level (lower) of the present invention; and FIG. 11 is a scanning electron micrograph showing micron and sub-micron dry etched interconnects using Al-Si-Ti and Al-Si layered with Ti. The equipment used in forming all of the films described in the present application was a magnetron sputtering system. The films were prepared by either depositing simultaneously or layering aluminum or Al-Si with other elements. Homogeneous films can also be made from a single target. In the sputtering process, the wafers sit vertically on a drum which rotates, passing in front of each target. The base pressure was below $1.5 \times 10^{-7}$ millibar (MBAR) and the argon gas pressure during sputtering was $2.0 \times 10^{-3}$ MBAR. To test for hillocks and resistivity, the films were deposited on thermally oxidized silicon substrates and exposed to 450° C. annealing in $H_2/N_2$ gas for 30 minutes. The presence of hillocks on the film was primarily determined by using an Alphastep surface profiler. Optical and scanning electron microscopy were also used.

The resistivity of films was determined by first using a four point probe to measure the sheet resistance; then steps were etched, and a surface profiler was used to determine the thickness. These measurements were done for deposited as well as annealed films.

In the preferred form of this invention, each level of a multilevel interconnection comprises either a plurality of alternating layers of Al-Si alternating with a refractory metal which is preferably Ti as shown in FIG. 1B; a single level of Al-Si with a level of a refractory metal, preferably Ti, on top as shown in FIG. 1A; or a single homogeneous film comprising Al-Si-Ti as shown in FIG. 1C. The approaches of FIGS. 1B and 1C are the preferred embodiment. In all embodiments, the presence of Si was essential to effective functioning of the film.

It has been found that the atomic percentage of Ti in the homogeneous film of FIG. 1C should be between 1 and 4 at. % with the preferred range being 2–3.5 at. % and the preferred level 2.5 at. %. The histograms of FIG. 10 which comprise short-circuit testing of capacitors fabricated using two-layer metalization show the improved results over the prior art using either the layered approach of FIG. 1B or the homogeneous film of FIG. 1C. Specifically, pure Al performed quite poorly, and Al-Si-Cu had an undesirable number of breakdowns below 120 volts. The use of 2.4 at. % Ti in homogeneous layers (slightly below the preferred range) reduced breakdowns further; the use of layered Al-Si-Ti was the ideal case.

It is especially interesting to note that a classic problem with adding impurities homogeneously to Al is that the resistivity increases. It is also well known that addition of silicon or copper increases the film resistivity as well as the further problems with the addition of copper of poor dry etchability and the liklihood of corrosion. Addition of Ti or W homogeneously also increases the resistivity. However, if the films are deposited in layers as shown in FIG. 1B, the resistivity can be kept low even after long anneals. In addition, no hillocks were observed. No prior work has resulted in such a dramatic reduction in the presence of hillocks. FIG. 8B shows the smooth surface profiles which result from the layered approach. It can be seen that Al-Si with a thin layer of Ti on the bottom is somewhat more effective (FIG. 8Bii) than Al or Al-Cu, but less effective than the other approaches of the present invention. This method has been tried earlier by other researchers for purposes of providing barrier metals. (See R. W. Bower, *Applied Physics Letters*, Vol. 23, No. 2, July 1973, p. 99.) The method of FIG. 8Bii is not as desirable as those disclosed above as shown graphically by the comparative surface profiles of FIG. 8. A layer of Ti on top of Al-si (FIG. 8Bi) is quite smooth and effective. Multiple layers of Ti alternating with Al-Si is close to the ideal case, as confirmed by FIG. 10.

To further reduce the resistivity of the layered films, thinner layers of Ti were deposited. It was found that films of Al-1 at. % Si with 100 angstroms of Ti resulted in an approximately 15% reduction in resistivity over that of films using 200 angstroms. The surface smoothness was the same (smooth at the 20 angstrom level).

However, when Ti layers of 50 angstroms were used, the films did show a low density of hillocks. Another possible way to reduce the resistivity of the films even further would be to lower the silicon concentration in the Al, but this may have the reverse effect because layered films of pure Al and Ti become virtually homogeneous after 30 minutes of annealing at 450° C. One interesting point to note is that even though the films of alternately sputtered pure Al and Ti become virtually homogeneous after the anneal, they are still smoother than films deposited homogeneously. Therefore, one could choose a certain thickness of Ti such as 100 angstroms and after annealing, the resulting film would consist of 3 at . % Ti if 100 angstroms of Ti were used for every 3000 angstroms of Al.

It has also been found that if Al-Si and Ti are deposited so as to form a homogeneous film as shown in FIG. 1C, similar but slightly less favorable results than the layered approach described above can be obtained.

Homogeneous films of Al-Si-Ti and Al-Ti were found to exhibit different annealing characteristics and had different resulting properties. First of all, it was found that if Si was not present in the Al, the surfaces were much rougher (see FIG. 8A). A crucial difference between homogeneous films with and without Si was that the resistivities of the Al-si-Ti films were consistently lower after annealing; structures without Si can have resistivity values 50% higher than those with Si. The effects of the silicon appear to be interpretable if one assumes this component is controlling the precipitate morphology forming very small ternary precipitates and reducing the concentration of Si in the Al layers. The Ti-Al-Si ternary phase diagram shows that the solid solubility limit of Si in $TiAl_3$ is much higher than that of pure Al. It also shows that if enough Si is present, a three phase region is entered. In our experiments, films of homogeneus Al-Ti were rough, the films of Al-Si-Ti were smooth when the concentration was below 4.0 at. % but above this value the films were rough. Large spike like hillocks which appear in FIG. 8Aiii begin at about 3.5 at. %.

It can be seen from Fig. 2 that hillocks constitute a major defect problem in pure aluminum or in Al-Cu-Si film. The surface profiles which are drawn beneath the pictures of FIG. 2 graphically illustrate the presence of dramatic hillocks in these prior art films, and the histograms of FIG. 10 indicate the likelihood of breakdown of capacitors formed using such films.

According to the present invention, by using Al-1 at. % Si with up to 4.0 at. %/Ti, or alternatively by layering Al-Si with Ti, the hillock problem can be virtually eliminated as demonstrated graphically in FIG. 3. It was found that the number of failures due to hillocks was significantly reduced in the testing of two level metal capacitors as shown in FIG. 4, made with at least one level of a homogeneous Al-Si-Ti film where the Ti was about 2.5 at. %.

The resistivity of film shown in FIG. 4 is plotted in FIG. 5, which shows that hillock-free films can be fabricated with a resistivity of 5.4 micro ohm-cm. the improvements in stress as a function of temperature for a homogeneous Al-Si-Ti film as compared to the prior art Al-Si or Al-Si-Cu films is dramatically shown in FIGS. 6 and 7. The dramatic improvement in surface profiles of layered and homogeneous films incorporating a refractory metal, preferably Ti, in Al-Si, is graphically demonstrated in the surface profile of FIG. 8. It is believed that films may be effective with as little as 1 at. % or as much as 4 at. % Ti. Some improvement is achieved with a different refractory metal such as tungsten (W) as shown in FIG. 9; it is also apparent from these surface profiles that problems remain possibly due to stresses.

In summary, the present invention discloses that conductive interconnections comprising a homogeneous film of Al-Si-Ti, or alternatively, Al-Si alternated with Ti provides hillock-free, dry etchable low resistivity electromigration resistant films. The films are also believed to be electromigration resistant. It appears that the use of tungsten in the homogeneous or layered films may also yield improved results if very low concentrations are used, although titanium would be preferable. It also appears that other refractory metals such as zirconium, tantalum, halnium, vanadium and chromium could produce good results. The presence of silicon in the aluminum film is necessary to achieve the desired results, because Si functions to keep the titanium layer intact. Finally, the resistivity of the layered films is lower than the homogeneous films, approaching the value for Al-Si alone.

What is claimed is:

1. In a semiconductor device, a conductive interconnect level formed on a silicon substrate, including an aluminum silicon titanium alloy wherein said titanium is 2-3.5 at. % of said alloy.

2. In a semiconductor device, a conductive formed on a silicon substrate including a homogeneous film of Al-Si with a refractory metal selected from the group consisting of titanium, tantalum, zirconium, hafnium, vanadium chromium, said titanium being 1-4 at. % of said film.

3. A semiconductor device as claimed in claim 2 wherein said refractory metal is titanium.

4. A semiconductor device as claimed in claim 3 wherein said titanium is 2-3.5 at. % of said film.

5. A semiconductor device as claimed in claim 3 wherein said titanium is about 2.5 at. % of said film.

6. A semiconductor device as claimed in claim 5 wherein said alloy includes about 1% silicon by weight.

7. An integrated circuit comprising a silicon substrate and a contact interconnect level comprising a homogeneous film of Al-Si with titanium wherein said titanium is 1-4 at. % of said film.

8. In a semiconductor device, a conductive level formed on a silicon substrate, including alternating layers of Al-Si with layers of a refractory metal.

9. A semiconductor device as claimed in claim 10 wherein said refractory metal is titanium.

10. A semiconductor device as claimed in claim 8 wherein said refractory metal is chosen from the group consisting of titanium, tantalum, zirconium, hafnium, Vanadium and chromium.

11. A semiconductor device as claimed in claim 9 wherein the conductive level is laid down on silicon or silicon dioxide, the Al-Si layer adjoining the silicon or $SiO_2$ layer.

12. A semiconductor device as claimed in claim 8 or 10 wherein said conductive level is formed of repeating layers of said Al-Si and said refractory metal.

13. A semiconductor device as claimed in claim 9 or 11 wherein said conductive level is formed of repeating layers of said Al-Si and said titanium.

14. A semiconductor device as claimed in claim 11 including at least two layers of titanium.

15. A semiconductor device as claimed in claims 11 or 14 including a layer of titanium on top of every layer of Al-Si.

* * * * *

UNITED STATES PATENT AND TRADEMARK OFFICE
CERTIFICATE OF CORRECTION

PATENT NO. : 4,673,623

DATED : June 16, 1987

INVENTOR(S) : Gardner et al.

It is certified that error appears in the above-identified patent and that said Letters Patent is hereby corrected as shown below:

Column 1, line 6, insert the following sentence:

--This invention was made with Government support under contract MDA-903-84-K-0062 awarded by the DARPA. The Government has certain rights in this invention.--

Signed and Sealed this

Seventeenth Day of January, 1995

Attest:

BRUCE LEHMAN

Attesting Officer

Commissioner of Patents and Trademarks